United States Patent [19]

Iwahashi et al.

[11] Patent Number: 4,611,301
[45] Date of Patent: Sep. 9, 1986

[54] READ ONLY MEMORY

[75] Inventors: Hiroshi Iwahashi, Yokohama; Masamichi Asano, Tokyo; Hidenobu Minagawa, Yokohama, all of Japan

[73] Assignee: Kabushiki Kaisha Toshiba, Japan

[21] Appl. No.: 597,351

[22] Filed: Apr. 6, 1984

[30] Foreign Application Priority Data

Apr. 7, 1983 [JP] Japan .................................. 58-61393
Feb. 21, 1984 [JP] Japan .................................. 59-30757

[51] Int. Cl.⁴ .............................................. G11C 7/02
[52] U.S. Cl. ...................................... 365/207; 365/104
[58] Field of Search ............... 365/104, 189, 205, 207, 365/210

[56] References Cited

U.S. PATENT DOCUMENTS

| | | | |
|---|---|---|---|
| 4,223,394 | 9/1980 | Pathak et al. | 365/210 |
| 4,301,518 | 11/1981 | Klaas | 365/185 |
| 4,494,219 | 1/1985 | Tanaka et al. | 365/189 |
| 4,503,523 | 3/1985 | Cavaliere et al. | 365/210 |

Primary Examiner—Joseph A. Popek
Attorney, Agent, or Firm—Finnegan, Henderson, Farabow, Garrett & Dunner

[57] ABSTRACT

Data is read out from memory cells in which "0" level and "1" level binary data have been stored, and a signal potential responsive to the readout data is compared with a comparison potential by a sense amplifier, thereby sensing the data. In a comparison potential generator, the above comparison potential is set to have the intermediate potential between a potential obtained by a dummy cell in which the "1" level data has been stored, and a potential obtained by a dummy cell in which the "0" level data has been stored.

12 Claims, 12 Drawing Figures

READ ONLY MEMORY

BACKGROUND OF THE INVENTION

The present invention relates to a read only memory using a nonvolatile memory device.

Read only memories using a nonvolatile memory device a floating gate structure as a memory cell can rewrite data. Therefore, such a memory is used in various systems including a microcomputer system. As is well known, the above nonvolatile memory device has two gates consisting of a floating gate and a control gate. When the electrons have been preliminarily injected into the floating gate, the threshold voltage is set to be high, so that even if a high level signal, e.g., +5 V, is applied to the control gate, the device will not be turned on. On the other hand, when no electron is injected in the floating gate, the threshold voltage is maintained to be inherently low, so that when a high level signal is applied to the control gate, the memory device will be turned on. In this way, in the memory using the nonvolatile memory device as the memory cell, data is stored by allowing the state in that when a high level signal was applied to the control gate of the memory device, the device is turned on or off to correspond to the "1" or "0" level of the data.

In the following description, the state in which the threshold voltage became a high level is set into the memory state of "0" level data, while the state which is inherently maintained at a low level is set into the memory state of "1" level data.

In addition, to inject electrons in the floating gate of the memory device, a high potential, e.g., +20 to +25 V, which is much higher than +5V, is applied to both the control gate and drain. Due to this, the impact ionization occurs in the channel region near the drain, causing electron-hole pairs, so that the electrons among them are injected in the floating gate. Since the electrons injected in the floating gate remain (except in the case where data is erased), once the data which has been stored in the memory device, it is held to be nonvolatile.

In the memory using such a floating gate memory device as the memory cell, a sense amplifier of the differential type is used to reduce the quantity of data to be written in the memory cell and to raise the data readout speed. Such a memory provided with the sense amplifier is disclosed in, for instance, the drawing of U.S. Pat. No. 4,223,394. In the memory shown, a dummy memory device is provided corresponding to the memory device. No electrons are injected in the floating gate of this dummy memory device, and a lower potential than that to be applied to the control gate when the memory device was selected is always applied to the control gate. Due to this, the reference potential which was set into the intermediate potential of the potential amplitude which varies depending upon the readout data from the memory device is formed, and the signal potential in response to the readout data is compared with the reference potential by a differential amplifier, thereby sensing the data.

This conventional memory is designed in such a manner that the reference potential under the particular power potential becomes the intermediate potential of the signal potential amplitude. Due to this, in the case where the power potential changed, or in case of making the system operative at a power potential different from the design power potential, the reference potential will have deviated from the intermediate potential of the signal potential amplitude. Consequently, upon reading out the data at "1" or "0" level, either margin can deteriorate causing the wrong data to be sensed.

SUMMARY OF THE INVENTION

It is therefore an object of the present invention to provide a read only memory which can always keep the data readout margin constant without depending upon the power potential.

According to the present invention, there is provided a read only memory comprising: memory cells consisting of memory devices for storing data; a comparison potential generating means for generating a comparison potential whose value varies in response to a power potential and whose gradients of value changes differ before and after the turning point of a predetermined power potential; and a data sense means for sensing the above data by comparing the signal potential obtained when reading out the data from the memory cells with the above comparison potential.

DETAILED DESCRIPTION OF THE PREFERRED EMBODIMENTS

Figure 1:
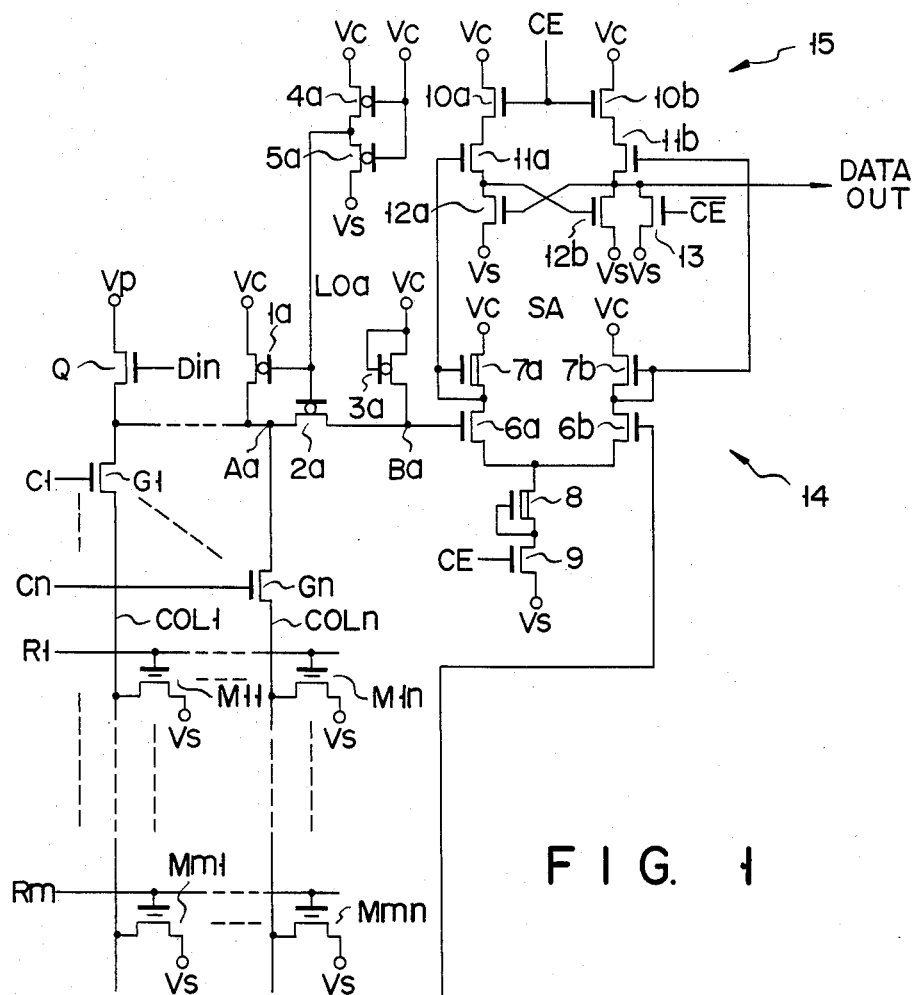
FIG. 1 is a circuit diagram showing a read only memory according to one embodiment of the present invention.
Figure 1:
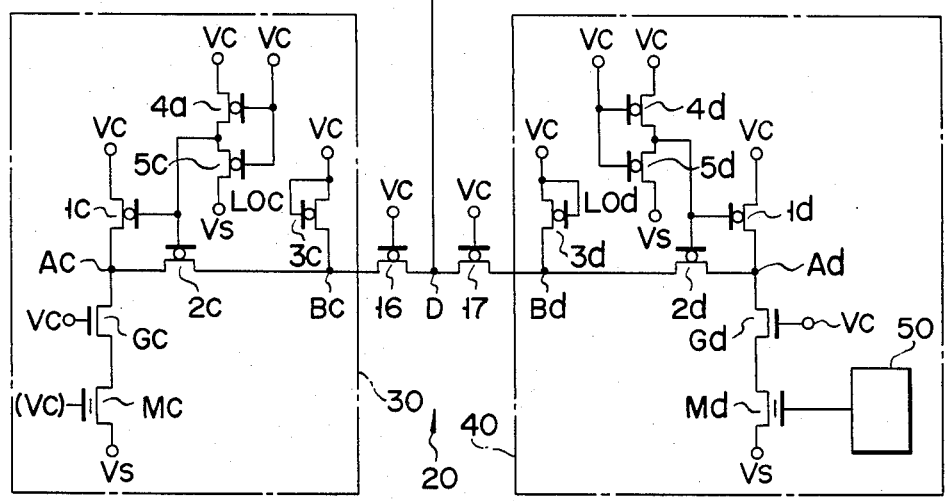

One embodiment of the present invention will be described hereinbelow with reference to the drawings. FIG. 1 is a circuit diagram showing a constitution of a read only memory of the present invention. In the diagram, $R_1$–$R_m$ denote row lines onto which the output of the row decoders (not shown) is given, and $C_1$–$C_n$ designate column selecting lines onto which the output of the column decoders (not shown) is given. In FIG. 1, n column-selecting MOS FETs $G_1$–$G_n$ are respectively driven by each of these column-selecting lines $C_1$–$C_n$. Each end of the MOS FETs $G_1$–$G_n$ is commonly connected to a node $A_a$, and each of the other ends is respectively connected to n column lines $COL_1$–$COL_n$ provided so as to perpendicularly cross the above row lines $R_1$-$R_m$.

Memory cells $M_{11}$-$M_{mn}$ each consisting of a MOS FET of the double-gate type having a floating gate and a control gate are provided at the point of intersection of the row lines $R_1$-$R_m$ and the column lines $COL_1$-$COL_n$. Each control gate of the above memory cells $M_{11}$-$M_{mn}$ is connected to the corresponding row line $R_i$ ($1 \leq i \leq m$); each drain is connected to the corresponding column line $COL_j$ ($1 \leq j \leq n$); and all sources are connected to an applying point of the ground potential $V_s$ (0 V).

A load circuit $LO_a$ consisting of MOS FETs $1_a$-$5_a$ whose threshold voltages were set at substantially 0 V (hereinafter, referred to 0 V threshold voltage MOSFET as I-type MOS FETs) is connected to the node A. In this load circuit $LO_a$, by means of the two MOS FETs $4_a$ and $5_a$ whose gates are jointly connected to an applying point of $V_c$ (power potential), and which are inserted in series between the $V_c$ applying point and the $V_s$ applying point, a lower potential than $V_c$ is formed from its serial connecting point. The potential at the node $A_a$ is set to be lower than $V_c$ by applying a lower potential than the above $V_c$ to the gate of the MOS FET $1_a$ whose source is connected to the node $A_a$ and whose drain is connected to the $V_c$ applying point, respectively. Furthermore, in the load circuit $LO_a$, also by applying the potential to be produced by the MOS FETs $4_a$ and $5_a$ to the gate of the MOS FET $2_a$, a node $B_a$ which is set into $V_c$ through the MOS FET $3_a$ is separated from the node $A_a$.

The reason why the above-mentioned two nodes $A_a$ and $B_a$ are separated by the MOS FET $2_a$ is as follows. That is, because the drain potentials (which are substantially the same as the potential at the node $A_a$) at the memory cells $M_{11}$-$M_{mn}$ are high upon reading out the data and because the electrons are injected in the floating gate which has been in the neutral state for a long time, the memory data may be inverted. Therefore, the node $A_a$ is maintained to be always not larger than $V_c$; the node $B_a$ is separated from the node $A_a$ through the MOS FET $2_a$; and the signal potential amplitude at the node $A_a$ is shifted to the level of $V_c$ by means of the node $B_a$.

A MOS FET Q for writing is inserted between the node $A_a$ and an applying point of a high potential $V_p$ to be supplied when writing data in the memory cells $M_{11}$-$M_{mn}$. An input data signal $d_{in}$ which is set at $V_p$ or $V_s$ in response to the level of the write data is supplied to the gate of this MOS FET Q.

A sense amplifier SA is constituted by MOS FETs $6_a$, $6_b$, 9, $10_a$-$12_a$, $10_b$-$12_b$, 13, and MOS FETs $7_a$, $7_b$, 8 of the depletion type (hereinbelow, referred to as D type). This sense amplifier SA comprises a differential amplifier 14 and an output circuit 15, and is of the well-known differential type having a chip selecting function by means of signals CE and $\overline{CE}$. The potential at the node $B_a$ is supplied as the signal potential which is compared and detected at the gate of the MOS FET $6_a$ at the input stage of the differential amplifier 14.

A comparison potential generator 20 serves to generate the comparison potential for the potential at the node $B_a$ to be detected in the above sense amplifier SA. The output potential from this comparison potential generator 20 is supplied as the comparison potential to the gate of the MOS FET $6_b$ at the input stage of the differential amplifier 14. This comparison potential generator 20 has two potential generators 30 and 40. The potential generator 30 is constituted by: a MOS FET $G_c$ whose drain is connected to the node $A_c$, whose gate is connected to the $V_c$ applying point, and which equivalently corresponds to the foregoing column-selecting MOS FETs $G_1$-$G_n$ (the channel lengths, widths, threshold voltages, etc. are identical); a double gate type MOS FET $M_c$ for a dummy cell which is inserted between the source of this MOS FET $G_c$ and the $V_s$ applying point, which equivalently corresponds to the above-mentioned memory cells $M_{11}$-$M_{mn}$ and whose floating gate is set into the neutral state; and a load circuit $LO_c$ which is constituted by MOS FETs $1_c$-$5_c$ each equivalently corresponding to the previously-mentioned MOS FETs $1_a$-$5_a$ and which has a circuit constitution equivalent to the foregoing load circuit $LO_a$.

The potential which is equal to the potential $V_c$ to be applied to each row line when selecting the row lines $R_1$-$R_m$ is always applied to the control gate of the MOS FET $M_c$ in the potential generator 30.

The other potential generator 40 has a circuit constitution which is equivalent to the above-described potential generator 30. The composing elements and portions corresponding to those of the potential generator 30 are designated by the same reference numerals except that each lower case alphabetic character thereof is changed from c to d. The bias ($V_c - \alpha$) which is output from a bias generator 50 (which will be described in detail later) is always lower than the power potential $V_c$ when a constant potential $\alpha$ is applied to the control gate of a MOS FET $M_d$ as a dummy cell in the potential generator 40. This constant potential $\alpha$ is set at a value which has a high threshold voltage to create the state which is equivalent to that of the "0" level data stored, in spite of the fact that the floating gate of the MOS FET $M_d$ is neutral, the threshold voltage is inherently kept low and that the "1" level data is stored.

One end of a MOS FET 16 of the I type is connected to the common connecting node $B_c$ of the MOS FETs $2_c$ and $3_c$ as the potential output point of the potential generator 30. One end of an I-type MOS FET 17 is connected to a common connecting node $B_d$ of MOS FETs $2_d$ and $3_d$ as the potential output point of the other potential generator 40. The other ends of the above two MOS FETs 16 and 17 are connected to a node D. The potential $V_c$ is always applied to their gates, and is supplied to the sense amplifier SA as the comparison potential.

This comparison potential generator 20 is provided with: two potential generators 30 and 40 having the MOS FETs $M_c$ and $M_d$ for dummy cells which are equivalent to the memory cells $M_{11}$-$M_{mn}$; MOS FETs $G_c$ and $G_d$ which are equivalent to the MOS FETs $G_1$-$G_n$ for selecting the column lines; and load circuits $LO_c$ and $LO_d$ which are equivalent to the load circuit $LO_a$. Both output potentials of those potential generators 30 and 40 are connected to the node D through the MOS FETs 16 and 17 serving as the impedance elements, thereby forming an intermediate potential having a value between that of the two output potentials at the node D. This potential is supplied to the sense amplifier SA.

In addition, all of the MOS FETs are of the enhancement type (hereinafter, referred to as E type) unless otherwise specified.

In such a circuit constitution, the floating gate of the MOS FET $M_c$ in the potential generator 30 is preliminarily set to be neutral, while the potential which is equivalent to the potential $V_c$ to be applied to the row lines $R_1$-$R_m$ is applied to the control gate. Due to this, the potential $VB_c$ at the node $B_c$ varies as shown in the characteristic diagram of FIG. 2 in association with a change in the power potential $V_c$. The various conditions in the MOS FET $M_c$ (for instance, each potential at the source, the drain and control gate, the dimensions of the elements, and the like) are set to be identical to those in the memory cells $M_{11}$-$M_{mn}$. Therefore, the change gradient at the node $B_c$ is the same as that of the signal potential caused at the node $A_a$ when one of the memory cells $M_{11}$-$M_{mn}$, in which the floating gate is set to be neutral and in which the "1" level data is stored, is selected.

Although the floating gate of the MOS FET $M_d$ in the other potential generator 40 is set at neutral a lower potential $(V_c-\alpha)$ than $V_c$ is supplied to its control gate. Due to this, the MOS FET $M_d$ is set to be equivalent to the memory state of the "0" level data such as when the electrons were injected in the floating gate. Therefore, the potential $VB_d$ at the node $B_d$ changes as shown in the characteristic diagram of FIG. 2 in association with a change in power potential $V_c$. The change gradient of this potential $VB_d$ is the same as that of the signal potential to be caused at the node $A_a$ when one of the memory cells $M_{11}$-$M_{mn}$ of which the electrons are injected in the floating gate and in which the "0" level data is stored was selected. In addition, the reason why the gradient of the potential $VB_d$ changes from a certain value as a turning point of $V_c$ in FIG. 2 is that when the value of $(V_c-\alpha)$ exceeds the threshold voltage of the MOS FET $M_d$, this MOS FET $M_d$ is turned on.

On the other hand, the potentials $VB_c$ and $VB_d$ at the nodes $B_c$ and $B_d$ are connected to the node D through the MOS FETs 16 and 17 serving as the impedance elements. Due to this, if the respective channel widths and channel lengths, etc. of the MOS FETs 16 and 17 are preset so that the impedances thereof are equal, it is possible to obtain a potential VD which has a value which is halfway between the potentials $VB_c$ and $VB_d$ as shown in FIG. 2 at the node D. Namely, the potential VD is supplied as the comparison potential to the sense amplifier SA; the change gradient of the value of this potential VD varies with changes in power potential $V_c$ from the threshold voltage as the turning point of the memory cell in which the "0" level data is stored; and the potential VD is set to have the intermediate potential of the signal potential amplitude at the node $B_a$ when the "0" level and "1" level data were read out from the memory cells $M_{11}$-$M_{mn}$. Due to this, even when the power potential $V_c$ changes, the comparison potential VD in the sense amplifier SA is always set to have the intermediate potential between $VB_c$ and $VB_d$. Therefore, the "0" level and "1" level data in the sense amplifier SA can both be sensed with a sufficiently high margin which is independent from the power potential $V_c$. That is, even when the power potential $V_c$ deviates from a predetermined value, the correct data can be always stably sensed in the sense amplifier SA.

Figure 2:
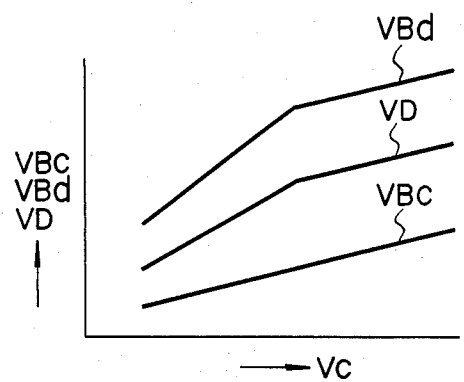
FIG. 2 shows a characteristic diagram of the memory in FIG. 1.

In addition to the above comparison potential generator 20, if the impedances of the MOS FETs 16 and 17 are set to be different, the potential VD in FIG. 2 will change to the state in which it does not only have an intermediate value between the potentials $VB_c$ and $VB_d$, but it also has a value which was shifted to the upper or lower side.

Figure 3:
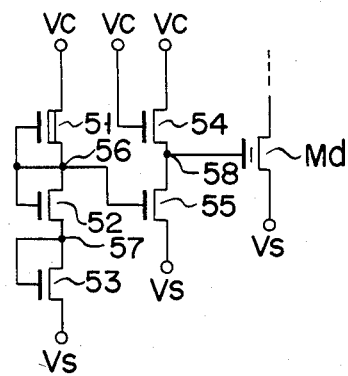
FIG. 3 is a practical diagram showing an example of a bias generator in the circuit of FIG. 1.

FIG. 3 is a circuit diagram showing a practical constitution of the bias generator 50 in FIG. 1. This circuit is constituted by one D-type MOS FET 51 and four E-type MOS FETs 52 to 55. The three MOS FETs 51, 52 and 53 are inserted in series between the $V_c$ applying point and the $V_s$ applying point, and each gate of the MOS FETs 51 and 52 is connected to a series connecting node 56 of these MOS FETs 51 and 52. The gate of the MOS FET 53 is connected to a series connecting node 57 of the MOS FETs 52 and 53. The two MOS FETs 54 and 55 are inserted in series between the $V_c$ applying point and the $V_s$ applying point. The gate of the MOS FET 54 is connected to the $V_c$ applying point. The gate of the MOS FET 55 is connected to the node 56. The potential at a series connecting node 58 of the MOS FETs 54 and 55 is set into $(V_c-\alpha)$ and this potential is supplied to the control gate of the MOS FET $M_d$.

In this circuit of FIG. 3, the potential at the node 56 is set into the sum $2V_{THE}$ ($V_{THE}$ is a threshold voltage of one E-type MOS FET) of threshold voltages of the MOS FETs 52 and 53. The node 56 is connected to the gate of the MOS FET 55 and a threshold voltage of this MOS FET 55 is also set into $V_{THE}$. Due to this, the MOS FET 55 always operates in the pentode region, thereby allowing a constant current to flow between the source-drain. On the other hand, although the current flowing through the source-drain intends to vary depending upon $V_c$ in the MOS FET 54, since its current is stabilized by the MOS FET 55, the impedance between the source-drain of the MOS FET 54 changes in response to a change in $V_c$. Due to this, the potential at the node 58 is set to have a value which is always lower than $V_c$ by only $\alpha$.

Now assuming that the threshold voltage of the MOS FET $M_d$ whose floating gate is in the neutral state is $V_{THM1}$ and that $V_{THM1}$ is set at a value which satisfies the following expression (1), then a current will flow through this memory cell.

$$V_c - \alpha > V_{THM1} \tag{1}$$

On the other hand, if the electrons are injected in the floating gate, if it is assumed that the threshold voltage of the memory cell in which the "0" level data has been written is $V_{THM2}$ (where $V_{THM2} > V_{THM1}$), and if $V_{THM2}$ is set to have a value that satisfies the following expression (2), then a current will flow through this memory cell.

$$V_c > V_{THM2} \tag{2}$$

By modifying the above expression (1), the following expression (3) can be obtained.

$$V_c > V_{THM1} + \alpha \tag{3}$$

Therefore, $(V_{THM1}+\alpha)$ is equal to the threshold voltage $V_{THM2}$ of the memory cell in which the "0" level data was written. For example, if a value of $\alpha$ is adjusted by setting the $g_m$ values of the MOS FETs 54 and 55, the MOS FET $M_d$ in the potential generator 40 can operate in the same manner as the memory cell in which the "0" level data was written in spite of the fact that no electron is injected in the floating gate.

Figure 4:
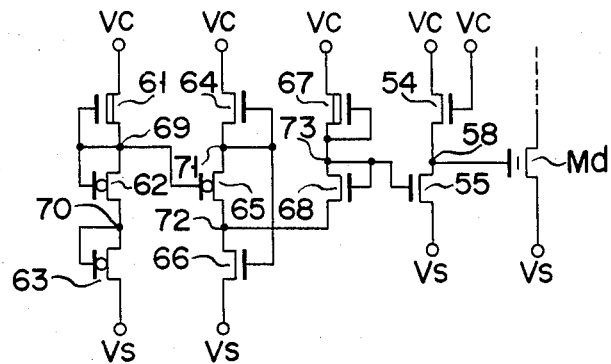
FIG. 4 is a practical diagram showing another example of the bias generator.

FIG. 4 is a circuit diagram showing another practical constitution of the bias generator 50. In the above circuit of FIG. 3, a variation in threshold voltage of the E-type MOS FET also causes the value of $\alpha$ to be remarkably varied. Due to this, in the circuit of FIG. 4, the influence due to the variation in threshold voltage of the E-type MOS FET is canceled in the manner as described below. Namely, a D-type MOS FET 61 and two I-type MOS FETs 62 and 63 are connected in series between the $V_c$ applying point and the $V_s$ applying point and; the gates of the MOS FETs 61 and 62 are connected to a series connecting node 69 of these MOS FETs 61 and 62. The gate of the MOS FET 63 is connected to a series connecting node 70 of the MOS FETs 62 and 63. Furthermore, an E-type MOS FET 64, an I-type MOS FET 65 and an E-type MOS FET 66 are connected in series between the $V_c$ applying point and the $V_s$ applying point; the gates of the MOS FETs 64 and 66 are connected to a series connecting node 71 of the MOS FETs 64 and 65; the gate of the MOS FET 65 is connected to the node 69, thereby producing the potential of $|V_{THI}|$ (where, $V_{THI}$ denotes the threshold voltage of one I-type MOS FET and is a value in a range from 0 V to about $-0.3$ V) at a series connecting node 72 of the MOS FETs 65 and 66. Moreover, a D-type MOS FET 67 and an E-type MOS FET 68 are connected in series between the $V_c$ applying point and the node 72; and the gates of the MOS FETs 67 and 68 are connected to a series connecting node 73 thereof producing the potential of $|V_{THI}| + V_{THE}$ (where, $V_{THE}$ denotes a threshold voltage of one E-type MOS FET) at the node 73. This potential is supplied to the gate of the MOS FET 55. With such a constitution, the variation in the threshold voltage of the MOS FET 55 is canceled, and the value of $\alpha$ is influenced by only the variation in the threshold voltage of the MOS FET 54. Therefore, the variation in the value of is suppressed to be lower than that of FIG. 3.

In addition, the MOS FETs 61 to 63 are provided to prevent the potential at the node 58 from becoming $(V_c - V_{THE})$. As a result, the threshold voltage of the I-type MOS FET has a positive polarity. Therefore, in value of $V_{THI}$ has a positive polarity, the MOS FETs 61–63 may be omitted, and the gate of the MOS FET 65 may be connected to the $V_s$ applying point. In addition, in the case of integrating the circuit of FIG. 4 in a silicon semiconductive substrate having a specific resistance of 50 ohms ($\Omega$), for example, assuming that the thickness of the gate insulating film is 800 Å, the $V_{THI}$ can be set into $-0.2$ V to $-0.3$ V without executing any special manufacturing process such as ion implantation of impurities, or the like.

Moreover, it is possible to use besides the bias generator 50 of FIGS. 3 and 4, a bias generator, with two D-type MOS FETs connected between the $V_c$ applying point and the $V_s$ applying point to divided the potential $V_c$. However, in this case, the value of $\alpha$ is not constant in the region where the power potential $V_c$ is low, resulting in a large error.

Figure 5:
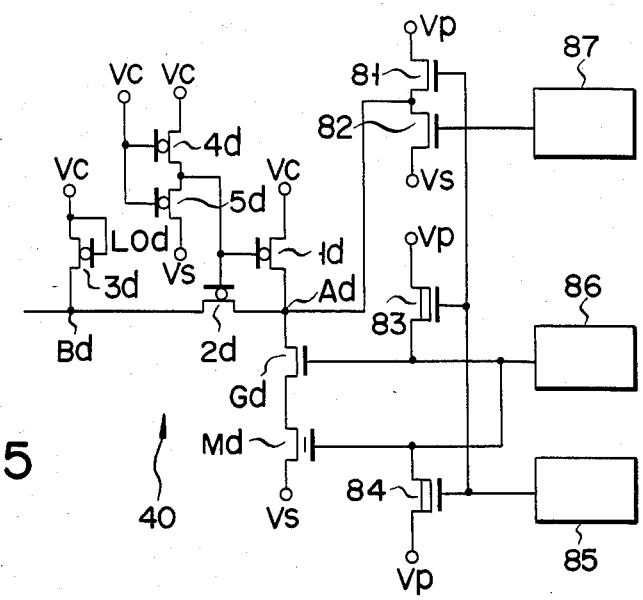
FIG. 5 is a circuit diagram showing a partial constitution of a read only memory according to another embodiment of the present invention.

FIG. 5 shows another embodiment of the memory according to the present invention, in which the only other potential generator 40 in the comparison potential generator 20 is shown. The constitution of the other portions is the same as that in FIG. 1. In the circuit of FIG. 1, the MOS FET $M_d$ for the dummy cell in the potential generator 40 is set into the state which is equivalent to the state in that the electrons are injected in the floating gate by supplying a lower potential than $V_c$ to the control gate in spite of the fact that the electrons are not actually injected into the floating gate.

On the contrary, in the circuit of FIG. 5, the electrons are actually injected in the floating gate of the MOS FET $M_d$ in the potential generator 40, thereby writing the "0" level data. Namely, the circuit of FIG. 5 is used in place of the potential generator 40 in FIG. 1 and is different from that in FIG. 1 with respect to the following points. First of all, two E-type MOS FETs 81 and 82 are inserted in series between the $V_p$ applying point to which the high potential $V_p$ is applied upon writing data and the $V_s$ applying point, and a series connecting node of these MOS FETs 81 and 82 is connected to a node $A_d$. The gate of the MOS FET $G_d$ is connected to the $V_p$ applying point through a D-type MOS FET 83 in place of the $V_c$ applying point. The control gate of the MOS FET $M_d$ is connected to the $V_p$ applying point through a D-type MOS FET 84, not to the output terminal of the bias generator 50. Furthermore, three control circuits 85 to 87 are provided in this circuit of FIG. 5. An output terminal of one control circuit 85 is connected to each gate of the MOS FETs 81, 83 and 84. In addition, an output terminal of another control circuit 86 is connected to the gate of the MOS FET $G_d$ and to the control gate of the MOS FET $M_d$. An output terminal of the remaining one control circuit 87 is connected to the gate of the MOS FET 82. In addition, as the MOS FET $M_d$ which is used in the circuit of FIG. 5, it is necessary to use a MOS FET such that data which has been once written is not erased even when ultraviolet rays are irradiated from the outside.

Figure 6:
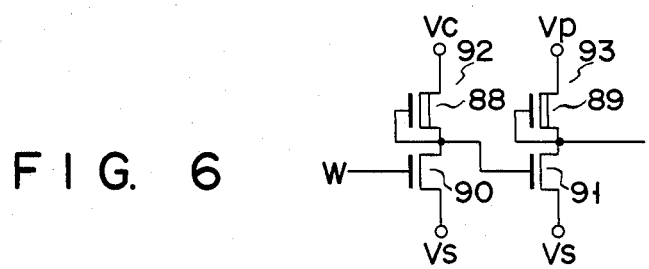
FIG. 6 is a practical diagram showing an example of one control circuit in the circuit of FIG. 5.

FIG. 6 shows a practical constitution of one control circuit 85 in FIG. 5. This circuit is constituted by cascade-connecting inverters 92 and 93. The inverter 92 is constituted by inserting a D-type MOS FET 88 and an E-type MOS FET 90 in series between the $V_c$ applying point and the $V_s$ applying point. The inverter 93 is constituted by inserting a D-type MOS FET 89 and an E-type MOS FET 91 in series between the $V_p$ applying point and the $V_s$ applying point. A control signal W is supplied to the inverter 92 at the front stage; this signal W is set at "1" level when writing the "0" level data in the MOS FET $M_d$. An output terminal of the inverter 93 at the post stage is connected to each gate of the MOS FETs 81, 83 and 84.

Figure 7:
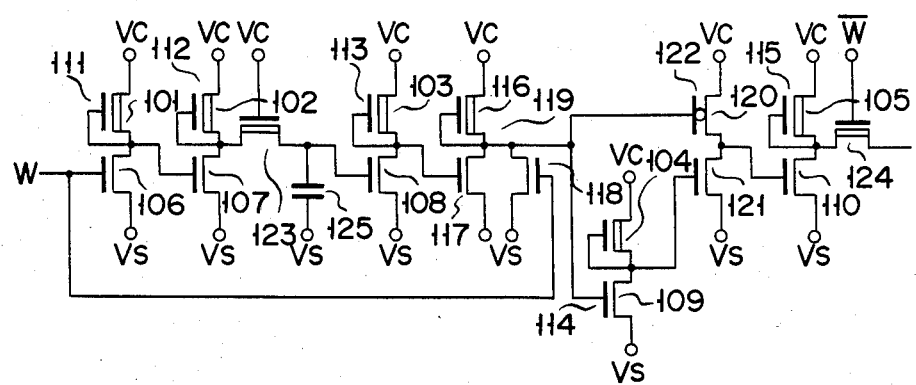
FIG. 7 is a practical diagram showing an example of another control circuit in the circuit of FIG. 5.

FIG. 7 shows a practical constitution of still another control circuit 86 in FIG. 5. This circuit comprises: inverters 111 to 115, each of which is constituted by respectively inserting each D-type MOS FETs 101 to 105 and each E-type MOS FETs 106 to 110 in series between the $V_c$ applying point and the $V_s$ applying point; a two-input NOR circuit 119 consisting of a D-type MOS FET 116 and an E-type MOS FET 117 which are inserted in series between the $V_c$ applying point and the $V_s$ applying point; an E-type MOS FET 118 connected in parallel to the MOS FET 117; a series circuit 122 consisting of an I-type MOS FET 120 and an E-type MOS FET 121 which are inserted in series between the $V_c$ applying point and the $V_s$ applying point; and two D-type MOS FETs 123 and 124 and a capacitor 125. The above-mentioned control signal W is supplied to the inverter 111. An output terminal of this inverter 111 is connected to an input terminal of the inverter 112. An output terminal of the inverter 112 is connected to an input terminal of the inverter 113 through the D-type MOS FET 123. The gate of the D-type MOS FET 123 is connected to the $V_c$ applying point.

The capacitor 125 is inserted between the input terminal of the inverter 113 and the $V_s$ applying point. An output terminal of the inverter 113 is connected to one input terminal of the two-input NOR circuit 119. In addition, the control signal W is supplied to the other input terminal of the NOR circuit 119. An output terminal of the NOR circuit 119 is connected to an input terminal of the inverter 114, and it is connected to the gate of the MOS FET 120 in the series circuit 122. An output terminal of the inverter 114 is connected to the gate of the MOS FET 121 in the series circuit 122. A series connecting node of the series circuit 122 is connected to an input terminal of the inverter 115. An output terminal of this inverter 115 is connected to one terminal of the D-type MOS FET 124. A signal $\overline{W}$ which is complementary to the control signal W is supplied to the gate of the MOS FET 124. The other terminal of the MOS FET 124 is connected to the gate of the MOS FET $G_d$ and to the control gate of the MOS FET $M_d$.

The remaining one control circuit 87 in FIG. 5 is constituted in the same manner as the circuit of FIG. 7 except that the inverter 115 and the D-type MOS FET 124 are removed from the circuit of FIG. 7, while the output terminal of the series circuit 122 is connected to the gate of the MOS FET 82.

In the circuit of FIG. 5, in the case of writing the "0" level data in the MOS FET $M_d$ by injecting the electrons in the floating gate of the MOS FET $M_d$, the control signal W to be applied to the control circuits 85-87 is set from "0" level to "1" level, and at the same time the high potential $V_p$ is applied to the control circuit 85. When the control signal W is set at "1" level, an output signal of the inverter 92 is set at "0" level in the circuit of FIG. 6, so that the high potential $V_p$ is output from the inverter 93. At this time, the MOS FETs 81, 83 and 84 are turned on in FIG. 5, so that a high potential $V_p$ or the potentials near it are introduced to the node $A_d$, the gate of the MOS FET $G_d$, and the control gate of the MOS FET $M_d$ through the MOS FETs 81, 83 and 84, respectively.

At this time, in the control circuit 86, an output signal of the NOR circuit 119 is set at "0" level in response to the input signal W, and an output signal of the inverter 114 is set at "1" level. Therefore, an output signal of the series circuit 122 is set at "0" level and an output signal of the inverter 115 is further set at "1" level, i.e., at the potential of $V_c$. Due to this, one terminal of the D-type MOS FET 124 is held to the potential of $V_c$. At this time the other terminal of this D-type MOS FET 124 is set at a potential close to $V_p$ by means of the MOS FETs 83 and 84, and the signal $\overline{W}$ applied to the gate of the MOS FET 124 is also set at "0" level, so that the MOS FET 124 is turned off. Therefore, the potential close to $V_p$ are applied to the gate of the MOS FET $G_d$ and the control gate of the MOS FET $M_d$.

In yet another control circuit 87, the output signal of the series circuit 122 is set at "0" level in the same manner as in the control circuit 86. Due to this, the MOS FET 82 is turned off and the high potential introduced to the node $A_d$ through the MOS FET 81 is applied as it is to the node $A_d$.

Due to this, the MOS FET $G_d$ is turned on and the high potential at the node $A_d$ is applied to the drain of the MOS FET $M_d$. Thus, the electrons in the electron-hole pair produced by the impact ionization caused in the channel region near the drain are injected in the floating gate of the MOS FET $M_d$ in which the high potential is applied to both the control gate and drain, so that the "0" level data is written therein.

Upon completion of the writing of the data in the MOS FET $M_d$, the control signal W supplied to the control circuits 85-87 is again set at "0" level. At the same time the high potential $V_p$ is no longer applied to the control circuit 85. Due to this, in the circuit of FIG. 6, the output signal of the inverter 93 is set at "0" level. Then in FIG. 5, the MOS FETs 81, 83 and 84 which were on up to this point are turned off, so that the supply of the high potential to the node $A_d$, the gate of the MOS FET $G_d$ and to the control gate of the MOS FET $M_d$ through these MOS FETs is stopped. However, even though the MOS FETs 81, 83 and 84 were turned off, parasitic capacities continue to exist in the node $A_d$, the gate of the MOS FET $G_d$, and in the control gate of the MOS FET $M_d$, respectively. Due to the parasitic capacities, the respective potentials remain high.

On the other hand, in the control circuit 86 when the input signal W is at "1" level, an output signal of the inverter 112 is set at "1" level, so that the capacitor 125 is charged to "1" level. In this state, the input signal W changes to "0" level. This change of the signal W causes the MOS FET 118 in the NOR circuit 119 to be turned off. In addition, immediately after the signal W changes, the output signal of the inverter 113 is set at "0" level since the capacitor 125 is in the charged state of "1" level. Therefore, the MOS FET 117 in the NOR circuit 119 is also turned off. Namely, the output signal of the NOR circuit 119 is set at "1" immediately after the signal W changes from "1" to "0". Due to this, the output signal of the inverter 114 is also set at "0" level. The output signal of the series circuit 122 is set at "1" level, and the MOS FET 110 in the subsequent inverter 115 is turned on. At this time, since the signal $\overline{W}$ supplied to the gate of the D-type MOS FET 124 is set at "1" level, the gate of the MOS FET $G_d$ and the control gate of the MOS FET $M_d$ (which continue to have high potentials due to the above-mentioned parasitic capacities) are discharged through the MOS FETs 124 and 110. After a certain amount of time has passed after the signal W has changed to "0" level, the capacitor 125 is discharged through the MOS FET 107 in the inverter 112, so that the output signal of the inverter 113 is set at "1" level. Then, the output signal of the NOR circuit 119 is set at "0" level, and the output signal of the inverter 114 is further set at "1" level. Due to this, the output signal of the series circuit 122 is set at "0" level, and the output signal of the inverter 115 is set at "1" level sequentially. Therefore, after the data is written, the gate of the MOS FET $G_d$ and the control gate of the MOS FET $M_d$ are both set at the potential of $V_c$ by the control circuit 86.

In another control circuit 87, the output signal of the NOR circuit 119 is set at "1" level immediately after the signal W changes from "1" level to "0" level. Then the output signal of the series circuit 122 is set at "1" level, so that the node $A_d$ which is maintained to the high potential due to the previously mentioned parasitic capacity is discharged through the MOS FET 82. Thereafter, after a certain amount of time has passed and after the capacitor 125 is discharged, the output signal of the series circuit 122 is set at "0" level, and the MOS FET 82 is turned off.

Figure 8:
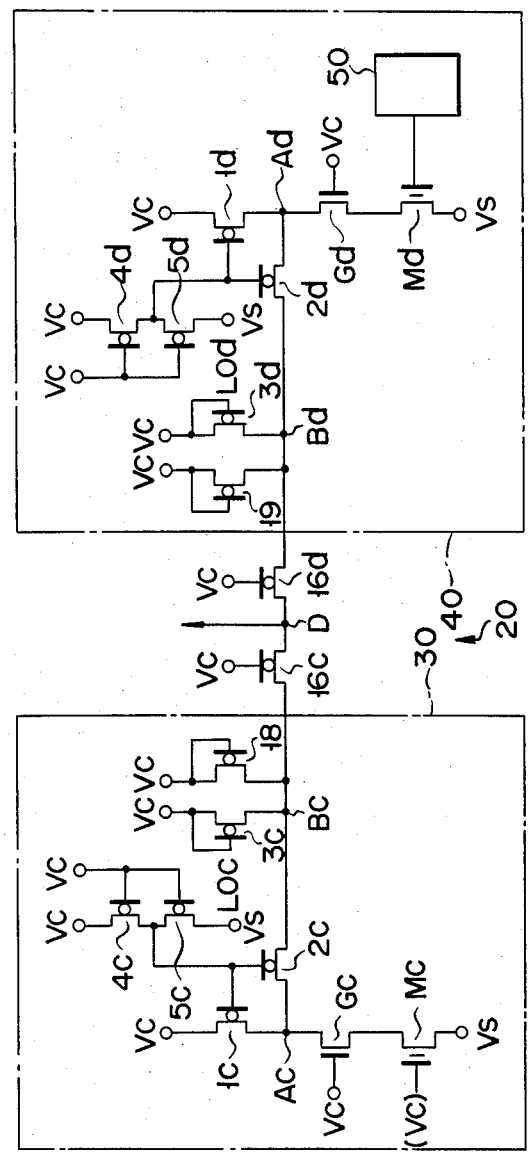
FIG. 8 is a circuit diagram showing a partial constitution of a read only memory according to yet another embodiment of the present invention.
Figure 9:
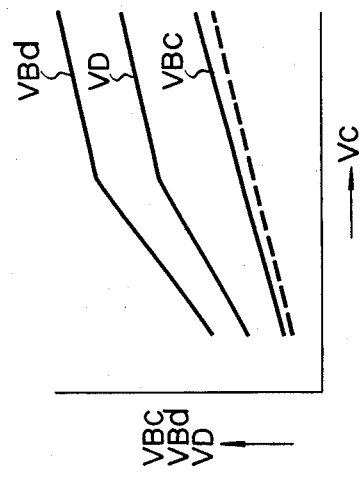
FIG. 9 shows a characteristic diagram of the memory in FIG. 8.

FIG. 8 shows another different embodiment of the memory according to the present invention, in which only the comparison potential generator 20 is shown. The constitution of the other portions is the same as in FIG. 1. In the circuit of the embodiment of FIG. 1, when the threshold voltages of the memory cells $M_{11}$-$M_{mn}$ vary and become high, the signal potential at a node $B_a$ when reading out the "1" level data approaches the comparison potential VD obtained at the node D, so that there may be a case where the "0" level or "1" level potential of the data to be output from the output circuit 15 does not sufficiently approach $V_s$ or $V_c$. In such a case, if the circuit is used having the increased power potential $V_c$, the MOS FET as a driver does not completely turn off due to the inverter or the like which receives the output data from the output circuit 15. This causes the current consumption to become abnormally large. In order to cope with the increased threshold voltages of the memory cells $M_{11}$-$M_{mn}$ due to the variation in the process conditions, as shown in FIG. 9, it is preferable to raise the potential $VB_c$ above the design value (indicated by the broken line in FIG. 9) to such extent as shown a solid line in FIG. 9, thereby shifting the comparison potential VD to the upper side. In the circuit of FIG. 8, the above-mentioned shift of the potential VD is realized by inserting an I-type MOS FET 18 between the node $B_c$ and the $V_c$ applying point in one of the potential generators 30, and by inserting a MOS FET 19 between the node $B_d$ and the $V_c$ applying point in the other potential generator 40. Also the proper selection of channel width and channel length of the MOS FET 18 or 19 enables one of the two MOS FETs to be omitted.

Figures 10, 11:
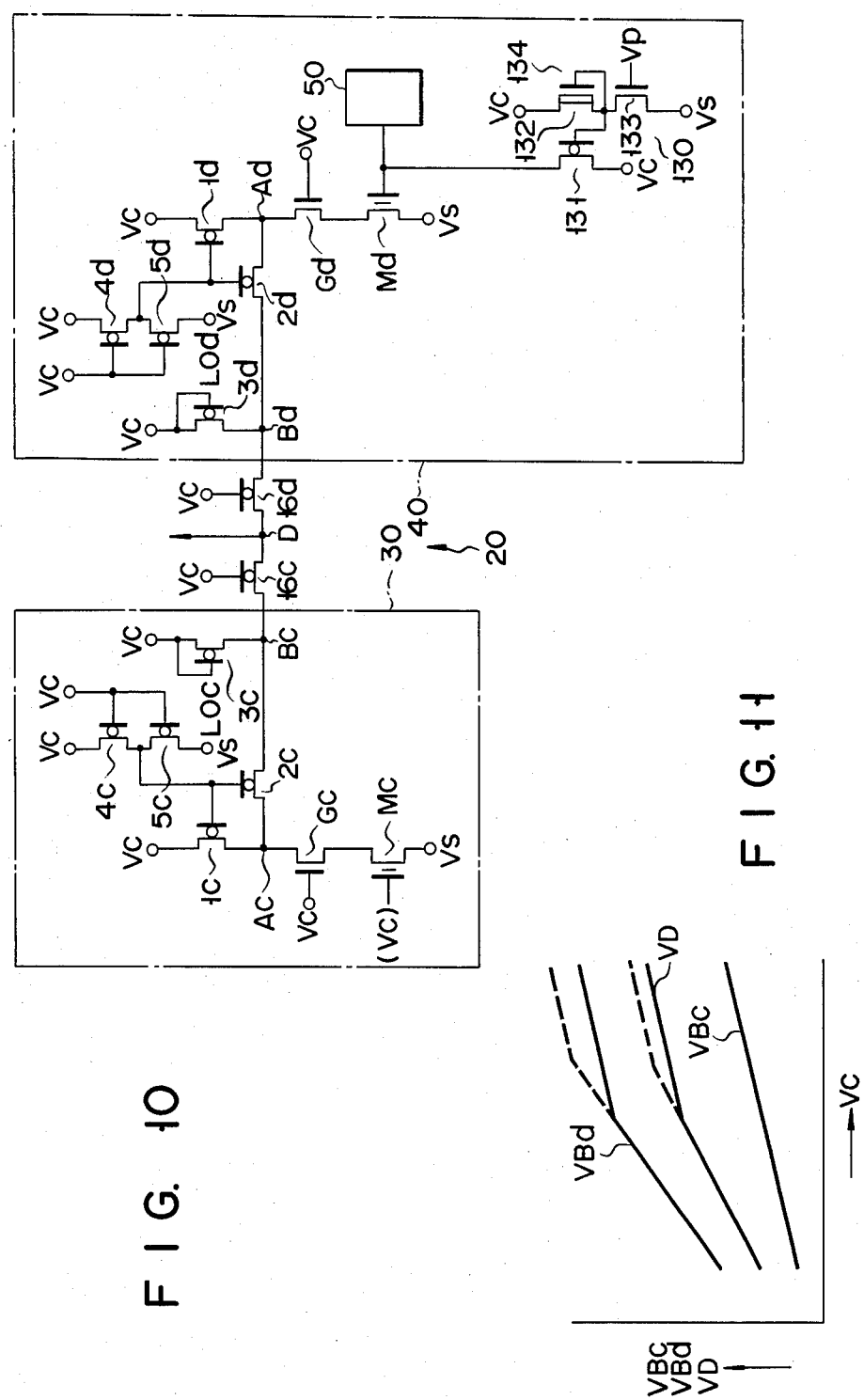
FIG. 10 is a circuit diagram showing a partial constitution of a read only memory according to still another different embodiment of the present invention.
FIG. 11 shows a characteristic diagram of the memory in FIG. 10.

FIG. 10 shows yet another different embodiment of the memory according to the present invention, in which only the comparison potential generator 20 is shown. The constitution of the other portions is the same as FIG. 1.

Recently, the number of the above-mentioned memory cells $M_{11}$-$M_{mn}$ used is extremely large, so that it takes a remarkably long time to write the "0" level data for all the bits. For instance, when the number of memory cells used is 256 kbits, assuming that the time necessary to write one bit is 50 milliseconds, about 30 minutes is required. A short program pulse is given only when data is written. Next, the data is read out from the memory cells while applying the high potential $V_p$ to the MOS FET Q. At this time, the sense amplifier SA discriminates whether the data was written or not. If no data is written, the program state is reset. In this way, an intelligent program method is adopted whereby the program state and readout state are alternately repeated. When it is discriminated that the data was written, the program is finished. This method contributes to a speedy programming time. According to this method, in order to discriminate whether the "0" level data was written or not, the potential $VB_a$ at the node $B_a$ is sensed in the sense amplifier SA as having a value that is higher or lower than that of the comparison potential VD. When the signal potential $VB_a$ is slightly higher than the comparison potential VD, the readout data is discriminated to be "0" level in the sense amplifier SA. In this case, a sufficient quantity of electrons is not injected in the floating gate of the memory cell as the writing of the data will have been finished. Unless a sufficient quantity of electrons is injected in the floating gate, the margin when reading out the "0" level data from the memory cell will become worse.

Therefore, in the circuit of the embodiment of FIG. 10, a control circuit 130 is added to the potential generator 40. The control circuit 130 is used to set the dummy cells in the threshold voltage of the MOS FET $M_d$, in which the "0" level data has been stored, to be higher than that in the case of FIG. 1 when the other potential generator 40 programmed the data in the memory cells $M_{11}$-$M_{mn}$. This control circuit 130 is constituted of an I-type MOS FET 131 inserted between the control gate of the MOS FET $M_d$ and the $V_c$ applying point, and an inverter 134 consisting of a D-type MOS FET 132 and an E-type MOS FET 133 which are inserted in series between the $V_c$ applying point and the $V_s$ applying point. The high potential $V_p$ is supplied to this inverter 134 at the time the memory cells $M_{11}$-$M_{mn}$ are programmed. An output signal of the inverter 134 is supplied to the gate of the MOS FET 131.

In such a circuit, when $V_p$ is set to have the same potential as $V_s$, the potential of $V_c$ is applied to the control gate of the MOS FET $M_d$ through the MOS FET 131. An output potential of the bias generator 50 is preliminarily adjusted so that the potential at the control gate of the MOS FET $M_d$ at this time coincides with the potential at the control gate of the MOS FET $M_d$ in FIG. 1. Therefore, when $V_p$ is set to have the same potential as $V_s$, the potential $VB_d$ at the node $B_d$ in the potential generator 40 of FIG. 10 is set to be identical to the potential $VB_d$ in FIG. 2 as indicated by the solid line in FIG. 11. Therefore, the potential VD at the node D is also set to be similar to the potential VD in FIG. 2 as indicated by the solid line in FIG. 11.

When data programming is performed in the memory cells $M_{11}$-$M_{mn}$, the high potential $V_p$ is applied to the inverter 134, so that the MOS FET 133 is turned on. This causes the MOS FET 131 to be turned off. Then, only the output potential from the bias generator 50 is applied to the control gate of the MOS FET $M_d$. At this time, the potential at the control gate of the MOS FET $M_d$ is set to be lower than it was prior to applying $V_p$. The threshold voltage of the MOS FET $M_d$ is set to be substantially higher than it was prior to applying $V_p$. The change of the potential of $VB_d$ for $V_c$, when $VB_d$ shifts to the upper side of a region where $V_c$ is higher, is indicated by the broken line in FIG. 11. Therefore, the potential VD at the node D also becomes higher when the level of VD shifts to the upper side in a region where $V_c$ is high as indicated by the broken line in FIG. 11.

Due to this, when data is programmed in the memory cells $M_{11}$-$M_{mn}$ under the power potential $V_c$ which is high to a certain degree since the comparison potential VD to be input to the sense amplifier SA is raised, "0" level data is written in the memory cell, where it can later be read out. Even if the writing is finished within the time determined by the sense amplifier SA, enough electrons will be injected in the floating gate of the memory cell.

Figure 12:
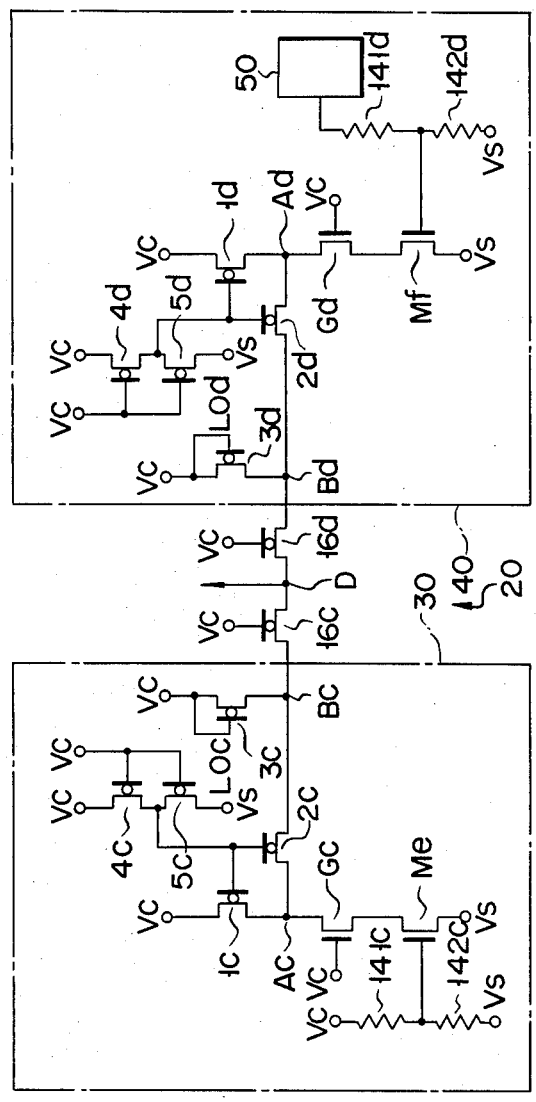
FIG. 12 is a circuit diagram showing a partial constitution of a read only memory according to another embodiment of the present invention.

FIG. 12 shows still another embodiment of the memory according to the present invention, in which only the comparison potential generator 20 is shown. The constitution of the other portions is the same as in FIG. 1. In this embodiment, ordinary E-type MOS FETs $M_e$ and $M_f$ are used in place of the MOS FETs $M_c$ and $M_d$ for the dummy cells in FIG. 1. To obtain characteristics similar to those of the MOS FETs $M_c$ and $M_d$ of the double gate structure, two resistors $141_c$ and $142_c$ and two resistors $141_d$ and $142_d$ are respectively provided in the potential generators 30 and 40. In the potential generator 30, the two resistors $141_c$ and $142_c$ are inserted in series between the $V_c$ and $V_s$ applying points. The gate of the MOS FET $M_e$ is connected to a series connecting node $143_c$ of these two resistors $141_c$ and $142_c$. In the other potential generator 40, the two resistors $141_d$ and $142_d$ are inserted in series between the output terminal of the bias generator 50 and the $V_s$ applying point. The gate of the MOS FET $M_f$ is connected to a series connecting node $143_d$ of these two resistors $141_d$ and $142_d$.

Generally, the floating gate potential in the MOS FET of the double gate structure having the floating gate is proportional to the potential applied to the control gate and has a high percentage value. Therefore, if the potential of $V_c$ or $(V_c-\alpha)$ is divided by the two resistors $141_c$, $142_c$ and by $141_d$, $142_d$, respectively, and if the potentials thus divided are supplied to the gates of the E-type MOS FETs $M_e$ and $M_f$, these MOS FETs $M_e$ and $M_f$ can perform the same function as MOS FETs having the floating gates.

As described above, in the read only memory according to the present invention, the data readout margin can always be independent of the power potential.

What is claimed is:

1. A read only only memory coupled to a power source comprising:
   memory cells consisting of memory devices for storing data;
   comparison potential generating means for generating a comparison potential having a value which varies in response to said power source's potential and for generating a different gradient of change for said comparison potential when said comparison potential is below a predetermined power potential than when said comparison potential is above said predetermined power potential, said predetermined power potential being less than said power source's potential; and
   data sense means for sensing said data stored in said memory cells by comparing a potential obtained when reading out the data from said memory cells with said comparison potential.

2. A read only memory according to claim 1, wherein said comparison potential generating means includes means for generating said comparison potential between a first potential and a second potential which correspond respectively to two types of binary data stored in said memory cells.

3. A read only memory according to claim 1, wherein said comparison potential generating means comprises:
   first potential generating means for generating a first potential which corresponds to one type of binary data stored in said memory cells;
   second potential generating means for generating a second potential which corresponds to another type of binary data stored in said memory cells; and
   two impedance means each having a first terminal connected to an output of a difference one of said first and second potential generating means and each said impedance means having a second terminal connected together,
   wherein the comparison potential is generated at the connection of said two impedance means.

4. A read only memory according to claim 3, wherein each of said two impedance means has a value such that said comparison potential at the connection of said first and second impedance means is set at an intermediate potential value between said first potential and said second potential.

5. A read only memory according to claim 3, wherein said first potential generating means has a first dummy memory cell which is configured to represent the storage of said one value for binary data stored in said memory cells, and
   wherein said second potential generating means has a second dummy memory cell which is configured to represent the storage of said another value for binary data stored in said memory cells.

6. A read only memory according to claim 3, further including means for shifting a level of either one of said first potential and said second potential.

7. A read only memory according to claim 5, wherein said first and second dummy cells both include nonvolatile memory devices which are equivalent to said memory cells.

8. A read only memory according to claim 5, wherein said first and second dummy cells both include double-gate type MOS FETs each having a floating gate and a control gate, the first dummy cell having its floating gate neutral, and the second dummy cell having electrons injected into its floating gate.

9. A read only memory according to claim 8, further including means for injecting electrons in the floating gate of said second dummy cell.

10. A read only memory according to claim 5, wherein said first and second dummy cells both include double-gate type MOS FETs each having a floating gate and a control gate, and wherein said first dummy cell has a first potential lower than said power source's potential coupled to its control gate thereof.

11. A read only memory according to claim 10, further including means for applying the first potential to the control gate of said first dummy cell.

12. A read only memory according to claim 10, further including means for further reducing the potential at the control gate of the first dummy cell when data is written in said memory cells.

* * * * *

UNITED STATES PATENT AND TRADEMARK OFFICE
CERTIFICATE OF CORRECTION

PATENT NO. : 4,611,301

DATED : September 9, 1986

INVENTOR(S) : Hiroshi Iwahashi et al.

It is certified that error appears in the above-identified patent and that said Letters Patent is hereby corrected as shown below:

On the face page of the patent under Assignee:

insert --Kawasaki-- between "Toshiba," and "Japan";

and insert the second assignee --TOSHIBA MICRO-COMPUTER ENGINEERING CORPORATION, Kawasaki, Japan--.

Signed and Sealed this

Twenty-seventh Day of January, 1987

Attest:

DONALD J. QUIGG

Attesting Officer

Commissioner of Patents and Trademarks